(12) United States Patent
Nikaido et al.

(10) Patent No.: US 7,642,466 B2
(45) Date of Patent: Jan. 5, 2010

(54) CONNECTION CONFIGURATION FOR RIGID SUBSTRATES

(75) Inventors: Shinichi Nikaido, Chiba (JP); Hiroki Maruo, Chiba (JP)

(73) Assignee: Fujikura Ltd., Tokyo (JP)

( * ) Notice: Subject to any disclaimer, the term of this patent is extended or adjusted under 35 U.S.C. 154(b) by 308 days.

(21) Appl. No.: 11/679,733

(22) Filed: Feb. 27, 2007

(65) Prior Publication Data
US 2007/0202306 A1  Aug. 30, 2007

(30) Foreign Application Priority Data
Feb. 27, 2006 (JP) .............................. 2006-050233

(51) Int. Cl.
*H05K 1/00* (2006.01)
(52) U.S. Cl. .................. 174/255; 174/250; 174/251; 174/254
(58) Field of Classification Search .......... 174/250–255
See application file for complete search history.

(56) References Cited

U.S. PATENT DOCUMENTS

| | | | | |
|---|---|---|---|---|
| 4,026,011 | A * | 5/1977 | Walton .......................... | 29/846 |
| 4,687,695 | A * | 8/1987 | Hamby ......................... | 428/192 |
| 4,931,134 | A * | 6/1990 | Hatkevitz et al. .............. | 216/17 |
| 5,144,742 | A * | 9/1992 | Lucas et al. .................... | 29/830 |
| 5,206,463 | A * | 4/1993 | DeMaso et al. ............... | 174/254 |
| 5,419,038 | A * | 5/1995 | Wang et al. .................... | 29/830 |
| 5,428,190 | A * | 6/1995 | Stopperan ..................... | 174/261 |
| 5,723,205 | A * | 3/1998 | Millette et al. ............... | 428/209 |
| 6,162,996 | A * | 12/2000 | Schmidt et al. .............. | 174/259 |
| 6,246,009 | B1 * | 6/2001 | Millette et al. ............... | 174/254 |
| 6,274,225 | B1 * | 8/2001 | Miyake et al. ............... | 428/209 |
| 6,288,343 | B1 * | 9/2001 | Ahn et al. ..................... | 174/254 |
| 6,350,387 | B2 * | 2/2002 | Caron et al. .................. | 430/314 |
| 6,603,079 | B2 * | 8/2003 | Biron .......................... | 174/254 |
| 7,378,596 | B2 * | 5/2008 | Kawaguchi et al. ......... | 174/255 |

FOREIGN PATENT DOCUMENTS

| | | |
|---|---|---|
| CN | 2479712 Y | 2/2002 |
| JP | 8-116147 A | 5/1996 |
| JP | 2001-36246 A | 2/2001 |
| JP | 2003-101165 A | 4/2003 |
| KR | 20040053734 | 6/2004 |

* cited by examiner

*Primary Examiner*—Cathy Lam
(74) *Attorney, Agent, or Firm*—Sughrue Mion, PLLC

(57) ABSTRACT

There is provided a configuration in which rigid substrates are connected via flexible substrates, the connection configuration having a pair of rigid substrates each having a predetermined circuit pattern on a front and a reverse surface thereof, a first flexible substrate attached on the front surfaces of the pair of the rigid substrates so as to electrically connect the circuit patterns provided respectively on the front surfaces, a second flexible substrate attached on the reverse surfaces of the pair of the rigid substrates so as to electrically connect the circuit patterns provided respectively on the reverse surfaces. The first and the second substrate have a gap therebetween smaller than a thickness of the pair of the rigid substrates.

4 Claims, 7 Drawing Sheets

CONNECTION CONFIGURATION FOR RIGID SUBSTRATES

CROSS REFERENCE TO RELATED APPLICATION

This application claims priority under 35 U.S.C. §119 to Japanese Patent Application No. 2006-050,233, filed on Feb. 27, 2006, the entire contents of which are incorporated by reference herein.

BACKGROUND

The present invention relates to a connection configuration for connecting a printed wiring boards, specifically to a connection configuration in which rigid substrates are connected via flexible substrates connected respectively to a front and a reverse surface of the rigid substrates, the flexible substrate serving as a flexible cable portion.

DESCRIPTION OF THE RELATED ART

There has been known a connection configuration of rigid substrates shown in FIG. 1 as related-art (see, Japanese Patent Application Laid-open Publication No. H08-116,147). As shown therein, the connection configuration is composed in which a pair of rigid substrates 101, 102 are connected with each other so that a flexible substrate 103 is attached at one end thereof on a front surface of the rigid substrate 101 and at the other end thereof on a front surface of the second rigid substrate 102 and the other flexible substrate 104 is attached at one end thereof on a reverse surface of the rigid substrate 101 and at the other end on a reverse surface of the rigid substrate 102. It should be noted that the flexible substrates 103, 104 are separated apart by a gap equal to a thickness of the rigid substrates 101, 102. In this connection configuration, the rigid substrates 101, 102 have wiring patterns on both side thereof, and these wiring patterns are electrically connected with each other by the flexible substrates 103, 104 attached on both side of the rigid substrates 101, 102, which allows many signal lines to be electrically connected in a rather small area.

However, when the flexible substrates 103, 104 are bent so as to allow the rigid substrates 101, 102 to oppose each other, one of the flexible substrates 103, 104 that constitutes an inner periphery of a curvature produced therein by bending has to suffer from an excessive stress applied therein, especially, in an area 104a, 104b near the rigid substrates 101, 102 (as shown in FIG. 2). Such a stress is caused by a relatively large difference between lengths along the inner and the outer periphery of the curvature.

In order to alleviate such a stress, there has been known a connection configuration in which there is provided a stiffness control portion in a shape of notch in a portion of the flexible substrates near the rigid substrate (see, Japanese Patent Application Laid-open Publication No. 2003-101, 165). Such a stiffness control portion is effective for alleviating flexural stress applied on the flexible substrate. However, one of the flexible substrates that constitutes the inner periphery of the curvature can be bent into a complicated shape, since the inward flexible substrate is prevented from freely deforming by the outward flexible substrate. This is because the flexible substrates have the same length between the rigid substrates. Such a complicated bending brings about a disadvantage that a working lifetime of the flexible substrate is shortened and an electrical disconnection in the wiring patterns tends to be caused.

The present invention has been made in view of the above disadvantage and an aspect thereof is to provide a connection configuration that is free from an excessive stress applied in a flexible substrate when it is bent and has a long working lifetime.

SUMMARY OF THE INVENTION

A first aspect of the present invention provides a connection configuration in which rigid substrates are connected via flexible substrates, having a pair of rigid substrates each having a predetermined circuit pattern on a front and a reverse surface thereof, a first flexible substrate attached on the front surface of the pair of the rigid substrates so as to electrically connect the circuit patterns provided respectively on the front surfaces, a second flexible substrate attached on the reverse surfaces of the pair of the rigid substrates so as to electrically connect the circuit patterns provided respectively on the reverse surfaces. The first and the second substrate have a gap therebetween smaller than a thickness of the pair of the rigid substrates.

A second aspect of the present invention provides a connection configuration according to the first aspect, where the first flexible substrate is attached on the front surfaces adjacent to one side surface of each rigid substrate of the pair of the rigid substrates, the first flexible substrate having a first curved portion in which the first flexible substrate bends from the front surfaces of the rigid substrates toward the reverse surfaces of the rigid substrates and having a second curved portion in which the first flexible substrate bends so as to be substantially parallel with the pair of the rigid substrates, where the second flexible substrate is attached on the reverse surfaces adjacent to the side surface of each rigid substrate of the pair of the rigid substrates, the second flexible substrate having a third curved portion in which the second flexible substrate bends from the reverse surfaces of the rigid substrates toward the front surfaces of the rigid substrates and having a fourth curved portion in which the second flexible substrate bends so as to be substantially parallel with the pair of the rigid substrates, and wherein a space substantially determined by the first curved portion, the second curved portion, the third curved portion, the fourth curved portion and the side surface of each of the rigid substrates is filled with a first adhesive.

A third aspect of the present invention provides a connection configuration according to the second aspect, further having a reinforcing plate provided in the space filled with the adhesive.

A fourth aspect of the present invention provides a connection configuration according to the second aspect, where the first adhesive is a resin, and where the first and the second flexible substrates are connected to each other by a lamination structure composed of a second adhesive, a reinforcing plate and a third adhesive laminated in this order, the lamination structure being provided so as to contact with the resin.

A fifth aspect of the present invention provides a connection configuration according to the first aspect, where the first and the second flexible substrates each have a wiring pattern that opposes each other when the first and the second flexible substrate are attached on the pair of the rigid substrates.

According to the present invention, since the flexible substrates are provided so that the gap therebetween is smaller than the thickness of the rigid substrates, there can be reduced a difference between lengths measured along the inner and the outer periphery of the curvature produced by the flexible substrates when they are bent. Therefore, the flexible substrate that constitutes the inner periphery of the curvature can be bent in substantially the same manner as the flexible substrate that constitutes the outer periphery thereof. As a result, a stress applied locally in the inward flexible substrate is reduced, thereby preventing an electrical disconnection. In addition, a stress applied between the flexible substrates and the rigid substrates is also reduced, thereby preventing a breakage of the connection configuration.

DETAILED DESCRIPTION OF EXEMPLARY EMBODIMENTS OF THE INVENTION

Non-limiting, exemplary embodiments of the present invention will now have to be described with reference to the accompanying drawings. It should be noted that the accompanying drawings, whether alone or there among, are not to scale but merely schematic representations and are not intended to portray the specific parameters or structural details of the invention, which should be determined by a person having ordinary skill in the art through the following description herein.

Figure 1:
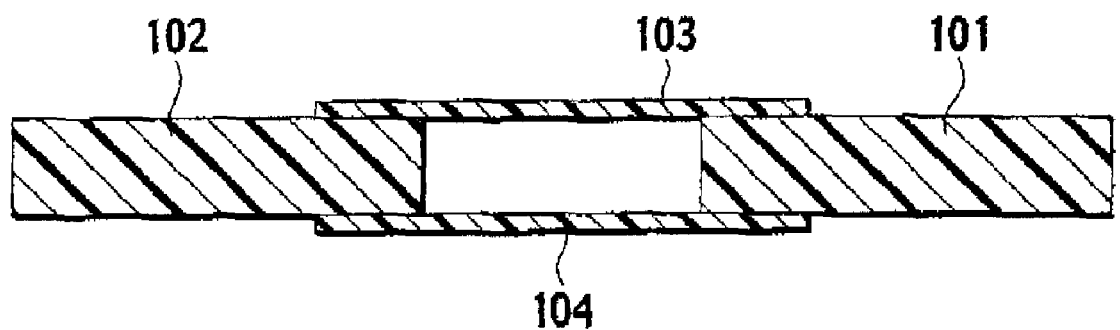
FIG. 1 is a cross-sectional view of a related-art connection configuration in which rigid substrates are connected with each other via flexible substrates, illustrating where the flexible substrates are unbent.
Figure 2:
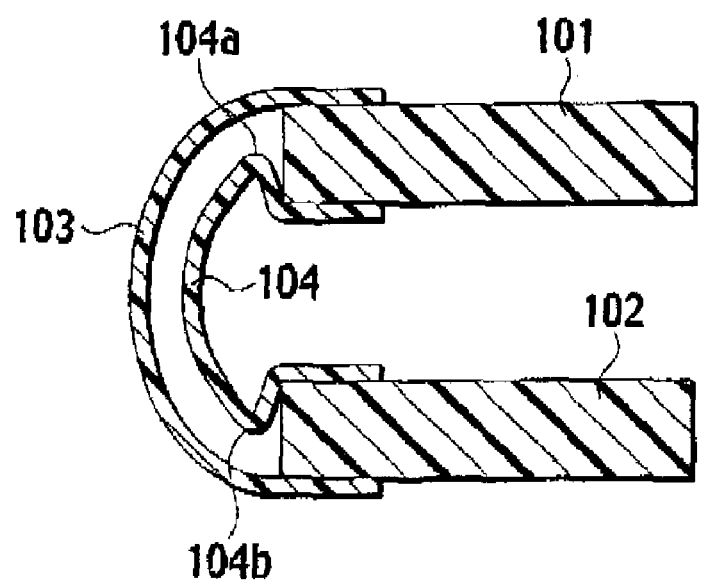
FIG. 2 is a cross-sectional view of the related-art connection configuration, illustrating where the flexible substrates are bent.
Figure 3:
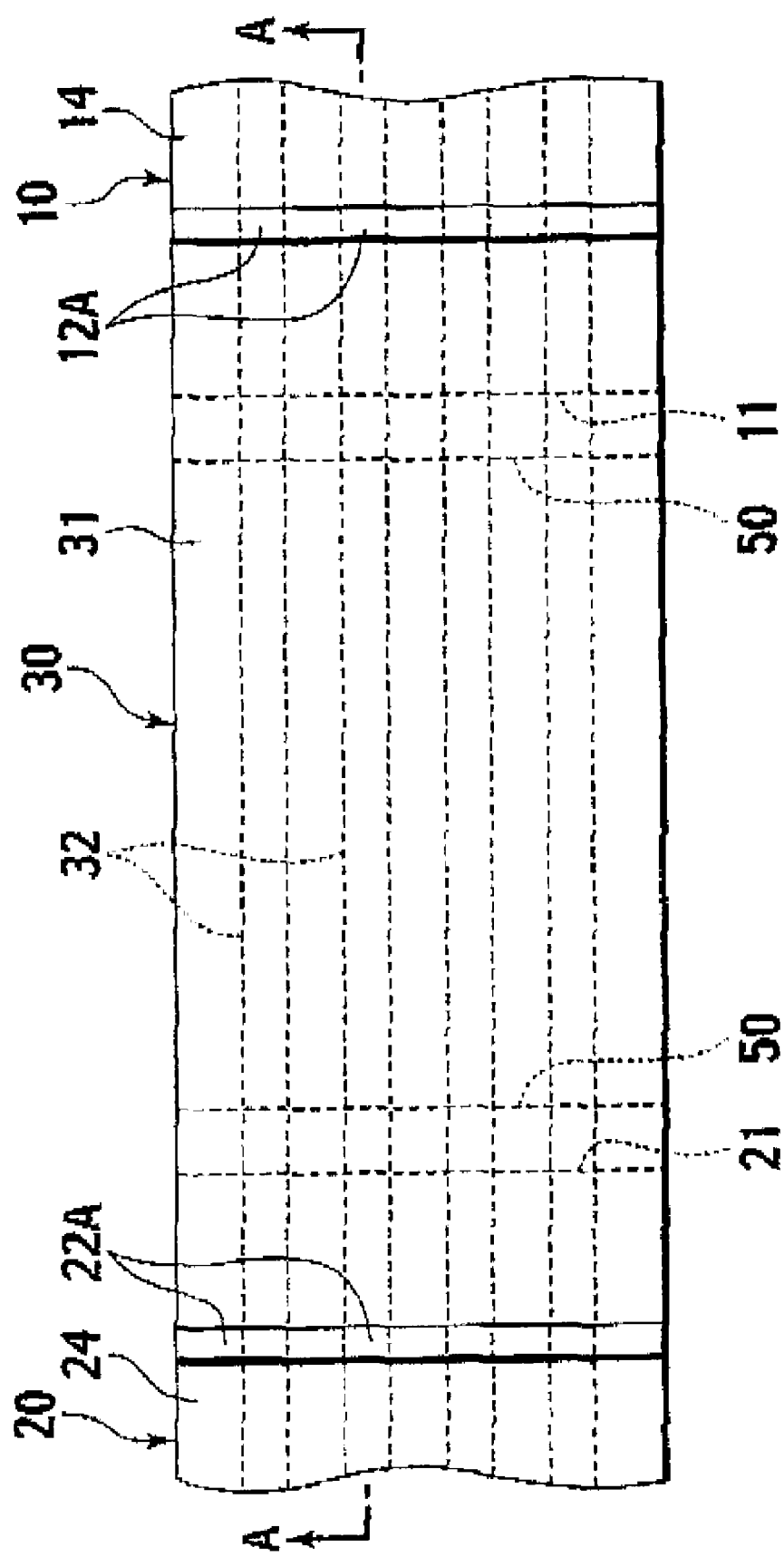
FIG. 3 is a plan view of a connection configuration according to a first embodiment of the present invention.
Figure 4:
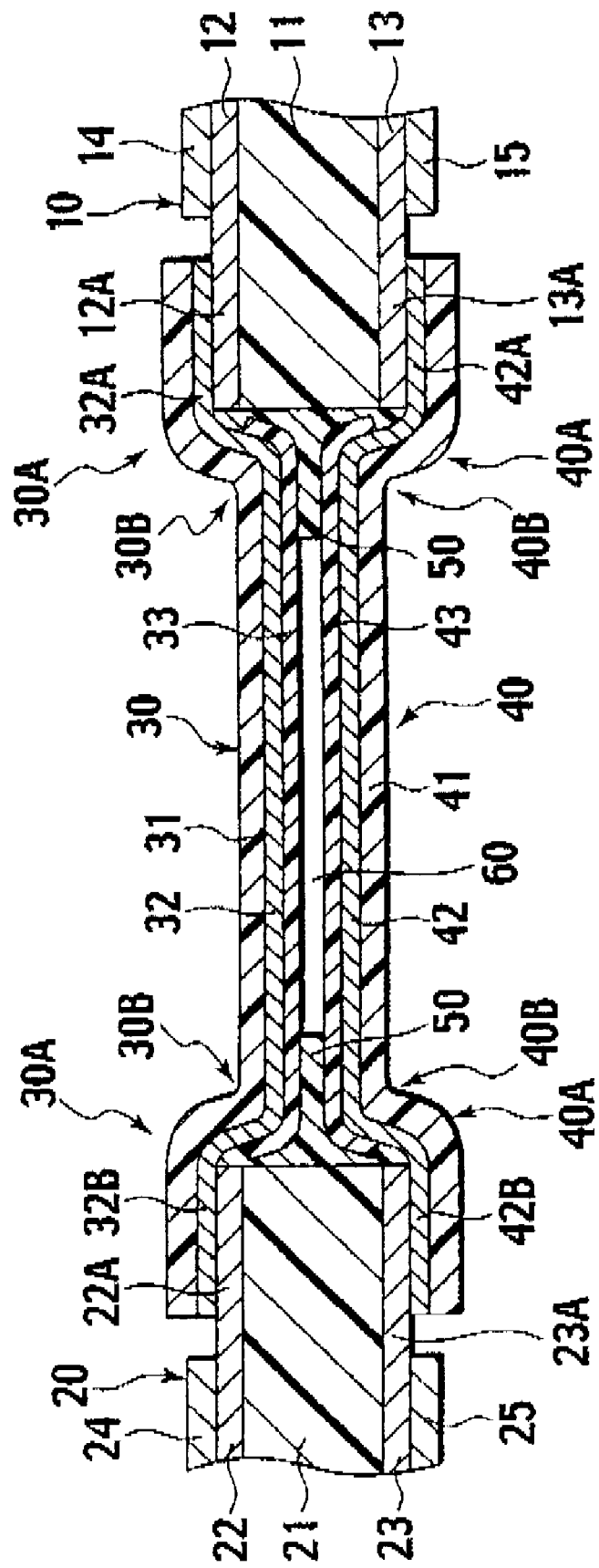
FIG. 4 is a cross-sectional view of the connection configuration taken along a line A-A.
Figure 5:
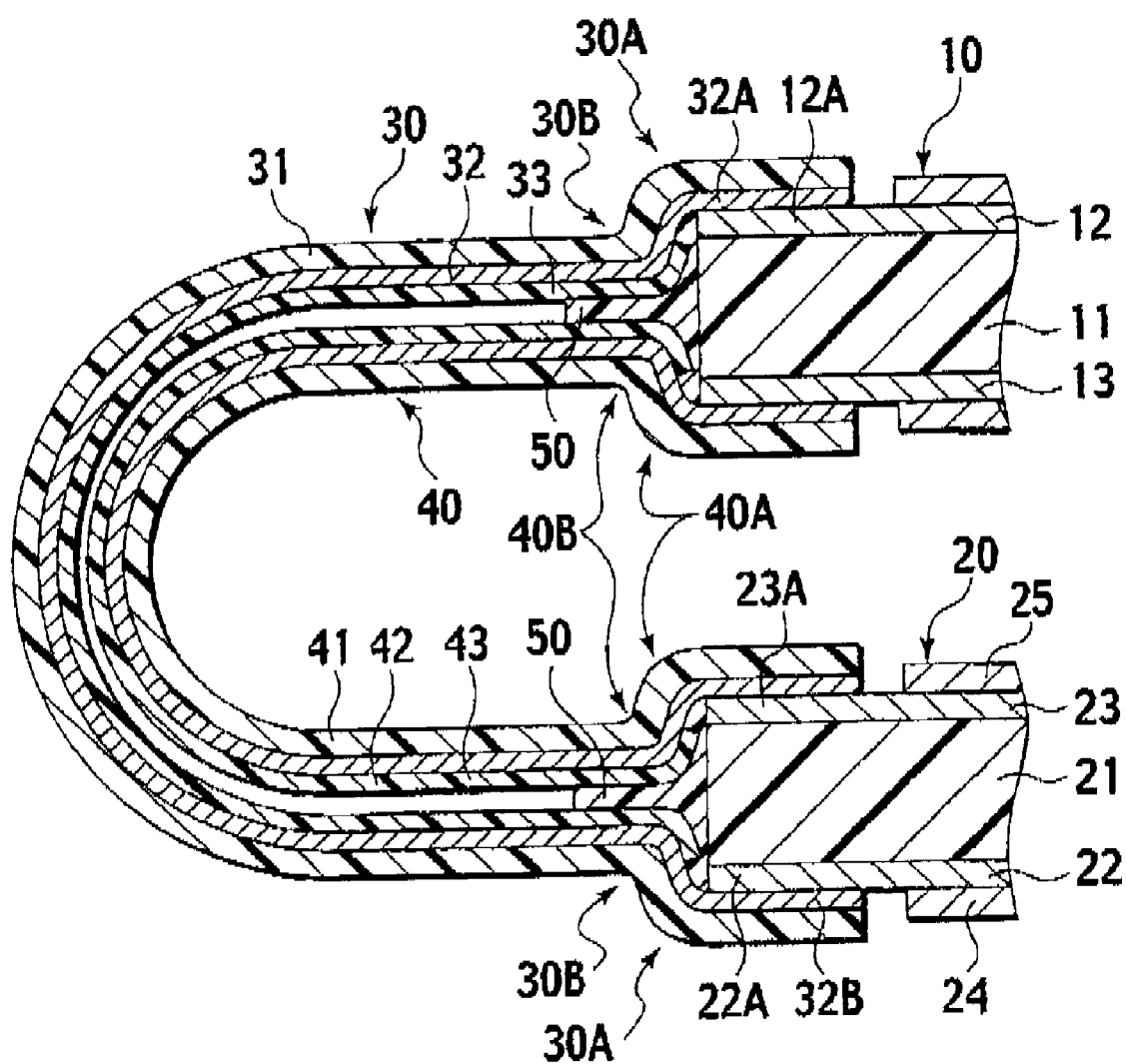
FIG. 5 is cross-sectional view of the connection configuration according to the first embodiment, illustrating where flexible substrates thereof are bent.

FIGS. 3 to 5 illustrate a connection configuration of rigid substrates according to a first non-limiting embodiment of the present invention. Specifically, FIG. 3 is a plan view illustrating the connection configuration of the rigid substrates; FIG. 4 is a cross-sectional view taken along a line A-A; and FIG. 5 is a cross-sectional view illustrating where the connection configuration is folded.

The connection configuration according to this embodiment is generally composed of a pair of a first and a second rigid substrate 10, 20, a pair of a first and a second flexible substrate 30, 40, and an adhesive 50, as shown in FIGS. 3 to 5. The first and the second flexible substrate 30, 40 have a gap therebetween that is smaller than a thickness of the first and the second substrate 10, 20 in a wide range between the first and the second rigid substrate 10, 20.

There will be described each component, before the connection configuration of the rigid substrate is described. As shown in FIGS. 4 and 5, the first rigid substrate 10 is generally composed of an insulating substrate (base material) 11, a plurality of wiring patterns 12 formed into a predetermined pattern on a front surface of the insulating substrate 11, a plurality of wiring patterns 13 formed into a predetermined pattern on a reverse surface of the insulating substrate 11, and resist layers (cover layers) 14, 15 formed respectively on the surfaces of the insulating substrate 11 via an adhesive (not shown).

The insulating substrate 11 is made of glass-epoxy SEM3, paper epoxy, or the like. The wiring patterns 12, 13 are formed by patterning a copper foil adhered on the insulating substrate 11 by employing for example a subtractive method. As the unshown adhesive, there can be used various types of resin adhesives such as polyimide, epoxy, olefin resin, or the like.

The first rigid substrate 10 includes a connection area in which a plurality of connection terminal portions 12A extending from the wiring patterns 12 are provided exposed on the front surface of the insulating substrate 11, and another connection area in which a plurality of connection terminal portions 13A extending from the wiring patterns 13 are provided exposed on the reverse surface of the insulating substrate 11. As depicted as "exposed", no resist layer is provided in the connection areas. The connection areas each are positioned in an end portion of the insulating substrate 11. Any one of the plurality of the connection terminal portions 12A is arranged, side-by-side, or parallel with a neighboring one; and any one of the plurality of the connection terminal portions 13A is arranged parallel with a neighboring one.

By the way, since the second rigid substrate 20 has substantially the same construction as the above-mentioned rigid substrate 10, the same or corresponding reference marks are given to the same or corresponding members (i.e., 21, 22, 23, 24, 25) and an undue repetition of explanation is eliminated.

The first flexible substrate 30 has a plurality of wiring patterns 32 on one surface of an insulating substrate 31. In one end portion of the one surface of the first flexible substrate 30, a plurality of connection terminal portions 32A are provided exposed; and in the other end portion thereof, a plurality of connection terminal portions 32B are provided exposed. The number of the connection terminal portions 32A is the same as the number of the connection terminal portions 12A of the first rigid substrate 10; and the number of the connection terminal portions 32B is the same as the number of the connection terminal portions 22A of the second rigid substrate 20. On the insulating substrate 31, having the wiring patterns 32 formed thereon, there is formed a cover layer 33 so that an area where the connection terminal portions 32A, 32B are provided is exposed to view. By the way, the insulating substrate 31 can be made of polyimide, polyethylene naphthalate (PEN), polyethylene telephthalate (PET) or the like.

Since the second flexible substrate 40 has substantially the same construction as the first flexible substrate 30, the same or corresponding reference marks (i.e., 41, 42, 42A, 42B, 43) are given to the same or corresponding members and an undue reception of explanation is eliminated.

In a connection configuration of the rigid substrate according to this non-limiting embodiment, the connection areas on both the front and the reverse surface of the first and the second rigid substrates 10, 20 are connected with each other by the first and the second flexible substrate 30, 40, respectively, as shown in FIG. 4.

Any one of the plurality of the connection terminal portions 32A on the one end portion of the first flexible substrate 30, is soldered to a corresponding one of the plurality of the connection terminal portions 12A of the first rigid substrate 10. As shown in FIG. 4, the first flexible substrate 30 has curved portions 30A, 30B. The curved portion 30A is positioned at the end portion of the first rigid substrate 10 where the first flexible substrate 30 is soldered thereon. In the curved portion 30A, the first flexible substrate 30 bends toward the other surface of the first rigid substrate 10. The curved portion 30B is provided adjacent to the curved portion 30A. In the curved portion 30B, the first flexible substrate 30 bends again in a direction substantially parallel with the first rigid substrate 10.

Any one of the plurality of the connection terminal portions 32B on the other end portion of the first flexible substrate 30 is soldered to a corresponding one of the plurality of the connection terminal portions 22A of the second rigid substrate 20. The first flexible substrate 30 has other curved portions 30A, 30B, which are the same as described above, also in relation to the second rigid substrate 20.

Any one of the plurality of the connection terminal portions 42A on the one end portion of the second flexible substrate 40 is soldered to a corresponding one of the plurality of the connection terminal portions 13A of the first rigid substrate 10. As shown in FIG. 4, the second flexible substrate 40 has curved portions 40A, 40B. The curved portion 40A is positioned at the end portion of the first rigid substrate 10 where the second flexible substrate 40 is soldered thereon. In the curved portion 40A, the second flexible substrate 40 bends toward the front surface of the second rigid substrate 10. The curved portion 40B is provided adjacent to the curved portion 40A. In the curved portion 40B, the second flexible substrate 40 bends again in a direction substantially parallel with the first rigid substrate 10.

Any one of the plurality of the connection terminal portions 42B on the other end portion of the second flexible substrate 40 is soldered to a corresponding one of the plurality of the connection terminal portions 23A of the second rigid substrate 20. The second flexible substrate 40 has other curved portions 40A, 40B in relation to the second rigid substrate 20.

As stated above, the first and the second flexible substrate 30, 40 are arranged so that the wiring patterns 32, 42 oppose each other while the insulating substrates 31, 41 lie outward.

As shown in FIG. 4, the first and the second flexible substrate 30, 40 are adhered with each other by an adhesive 50 filled in a space determined substantially by the curved portion 30A, 30B, the curved portion 40A, 40B, and an side face of the first or the second rigid substrate 10, 20, leaving a gap therebetween that is smaller than a thickness of the first and the second rigid substrate 10, 20 in a wider range between the first and the second rigid substrate 10, 20.

By the way, since the adhesive 50 is limited to the space, the gap 60 between the first and the second flexible substrate 30, 40 is kept hollow in this embodiment.

FIG. 5 is a cross-sectional view of the connection configuration, illustrating where the first and the second flexible substrate 30, 40 are bent at their middle portion so that the first and the second substrate 10, 20 are arranged parallel with each other. Even when bent in such a way, since there is only a small difference between lengths measured along the inner and the outer periphery of the curvature produced by the bending, one of the flexible substrates that constitutes the inner periphery is subjected to substantially the same bending deflection as the other flexible substrate that constitutes the outer periphery. Therefore, the inner flexible substrate can be free from an excessive stress that can be locally applied therein, thereby preventing a disconnection or a local degradation of the wiring pattern therein. This is because the first and the second flexible substrate 30, 40 are adhered with each other by the adhesive 50 so that there leaves a hollow gap therebetween smaller than a thickness t (shown in FIG. 6) of the first and the second rigid substrate 10, 20 in a wide range between the rigid substrates 10, 20.

Moreover, according to the connection configuration of this non-limiting embodiment, a stress can be achieved from applying on a connection portion where the flexible substrate 30, 40 are soldered on the rigid substrate 10, 20, thereby preventing breakage of the connection portion.

Furthermore, the first and the second flexible substrate 30, 40 are arranged so that the wiring pattern 32, 42 are positioned on the inward side, facing each other, while the insulating substrate 31, 41 are positioned on the outward side. Therefore, when the first and the second flexible substrate 30, 40 are bent, the wiring pattern 32, 42 are under a lower stress in comparison with where the wiring pattern 32, 42 were positioned in the outward side, which improves durability of the wiring patterns 32, 42.

There will be described hereinafter an example exemplifying a specific material and dimension of the connection configuration of the rigid substrates according to the first non-limiting embodiment. A thickness of the insulating substrate 11, 21 of the first and the second rigid substrate 10, 20 respectively is for example 0.4 mm, 0.6 mm, 0.8 mm, 1.0 mm, 1.2 mm, 2.0 mm, 2.4 mm. A material used to make the insulating substrate 11, 21 is for example glass-epoxy SEM-3, or the like. On the other hand, a thickness of the insulating substrate 31, 41 of the first and the second flexible substrate 30, 40 respectively can be 25 μm as a standard and a half, a one-third, a one-fourth or the like of the standard thickness. A thickness of the wiring pattern 32, 42 formed on the insulating substrate 31, 41 can be 35 μm as a standard and a half, a one-third, or a one-fourth or the like of the standard thickness.

The wiring pattern 12, 13, 22, 23, 32, 42 are made of a rolled copper foil, or an electrolytic-plated copper foil. The connection terminal portion 12A, 13A, 22A, 23A, 32A, 32B, 42A, 42B have a width of 10 to 500 μm and a separation therebetween of 10 to 500 μm.

The first and the second flexible substrate 30, 40 have a length preferably determined taking account of how the flexible substrate 30, 40 are to be bent after they are installed in an electric appliance. Specifically, when the flexible substrate 30, 40 are twisted so that the rigid substrate 30 is moved to a position in a twist relation to the rigid substrate 40, and vice versa, (or in a so-called alpha-winding pattern), the length of the flexible portion of the flexible substrate 30, 40 is preferably from 30 to 100 mm. On the other hand, when the flexible substrate 30, 40 are bent so that the flexible substrate 30, 40 and the rigid substrate 10, 20 form a shape of L as a whole, the length of the flexible portion of the flexible substrate 30, 40 is preferably from 5 to 30 mm.

A thickness of the cover layer 33, 43 is 25 μm or 12 μm. A thickness of the adhesive that adheres the cover layer 33, 43 is for example from 10 to 30 μm. It is not to be argued that each member of the connection configuration according to the present invention is not limited to the above materials and values.

With such components, the connection configuration according to this example is realized for example in the following manner. The connection terminal portions 12A of the first rigid substrate 10 each are soldered with a corresponding one of the connection terminal portions 32A of the first rigid substrate 30. The connection terminal portions 13A of the first rigid substrate 10 each are soldered with a corresponding one of the connection terminal portions 42A of the second flexible substrate 40. The first and the second flexible substrate 30, 40 are adhered in a vicinity of the first rigid substrate 10 by the adhesive 50 so that curved portion 30A, 30B, 40A, 40B are produced. Then, the same procedure is repeated for the second rigid substrate 20, the first and the second flexible substrate 30, 40. By the way, the soldering is carried out by firstly forming a plating solder layer on at least one of the connection terminal portions to be soldered, and then by applying heat and pressure thereon employing a heater chip (heater head). It is not limited to soldering to electrically connect the connection terminal portions, but a soldering paste, a lead-free soldering paste, a lead-plating, a ultrasonic welding or the like method can be employed.

Figure 6A:
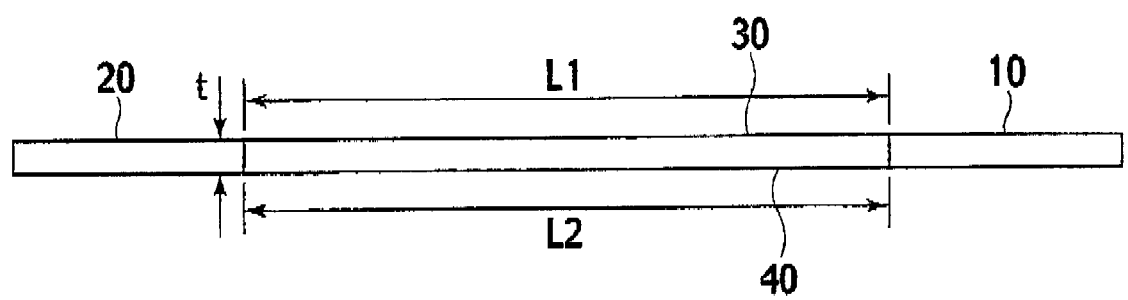
FIG. 6A is an explanatory view of a connection configuration composed so that flexible substrates thereof have a gap equal to a thickness of a first and a second rigid substrate thereof, illustrating where the flexible substrates are unbent.
Figure 6B:
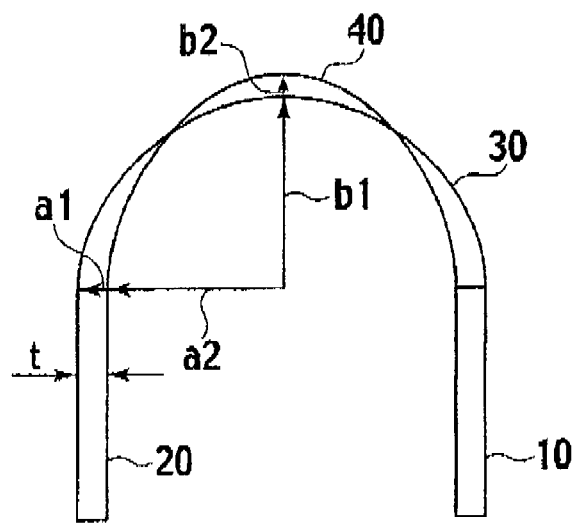
FIG. 6B is an explanatory view of the connection configuration shown in FIG. 6A, illustrating where the flexible substrates are bent on the assumption that they can bend freely.
Figure 6C:
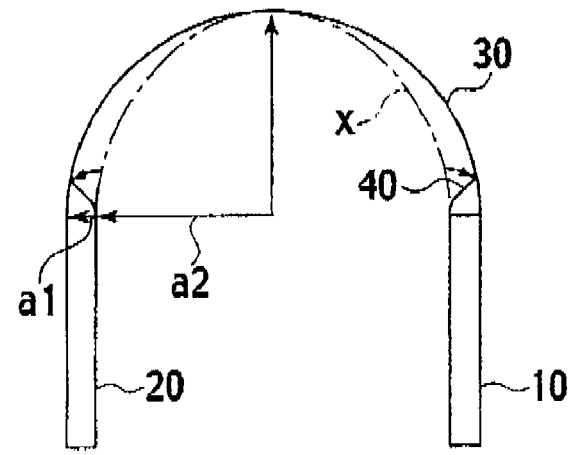
FIG. 6C is an explanatory view of the connection configuration shown in FIG. 6A, illustrating that a kink is produced in an inner flexible substrate when the flexible substrates are bent.

Referring to FIGS. 6A to 6C, there will be explained a mechanism that causes stress concentration on the flexible substrate and a reason why less stress is caused in the connection configuration according to the non-limiting embodiment described above.

FIG. 6A is a schematic view illustrating where the front surfaces of the first and the second rigid substrate 10, 20 are connected together with the first flexible substrate 30 and the reverse surfaces of the first and the second rigid substrate 10, 20 are connected together with the second flexible substrate 40. As shown in FIG. 6A, a length of the first and the second flexible substrate 30, 40 is assigned as L1, L2, respectively. Assuming that the first and the second flexible substrate 30, 40 can freely bend into a U-shape without being disturbed by each other when they are bent, the first and the second flexible substrate 30, 40 assume a natural shape as shown in FIG. 6B. However, since the first and the second flexible substrate 30, 40 are overlaid with each other in reality, a middle portion of the second flexible substrate 40 abuts a middle portion of the first flexible substrate 30 when they are bent to a greater degree, which prevents the second flexible substrate 40 from freely deforming. As a result, the second flexible substrate 40 comes to produce a kink having a narrower curvature near the first and the second rigid substrate 10, 20. Such a kink tends to be produced more easily when there is a larger difference between the length L1 of the first flexible substrate 10 and a length L2$x$ of an inner periphery $x$ shown by a dashed line in FIG. 6C.

Assuming that a curve that the freely-bent first flexible substrate 30 takes a shape of is an ellipsoidal curve having a minor axis a1 and a major axis b1, the length L1, L2$x$ are given by:

$$L1 = 2\pi((a1^2 + b1^2)/2)^{1/2}$$

$$L2x = 2\pi((a2^2 + b2^2)/2)^{1/2}.$$

When the thickness of the flexible substrate 30, 40 is negligible, there is obtained:

$$b1 = b2.$$

Moreover, when the thickness of the rigid substrate 10, 20 is assigned as t, the following equation holds:

$$a2 = a1 - t.$$

Therefore, a difference $\Delta$ between L1 and L2$x$ is given by:

$$\Delta = 2\pi((a1^2 + b1^2)/2)^{1/2} - 2\pi(((a1-t)^2 + b1^2)/2)^{1/2},$$

where $a1 - t > 0$.

Accordingly, when a1 and b1 is determined, or L1 is determined, it is understood that the greater the thickness t becomes, the greater the difference $\Delta$ is. In other words, when the first and the second rigid substrate 10, 20 becomes thicker, it becomes more difficult for the second flexible substrate 40 to freely deform so as to take a natural shape.

In view of the foregoing estimate, it can be said that the second flexible substrate 40 can be more freely deformed when the gap of the first and the second flexible substrate 30, 40 is made smaller in the vicinity of the first and the second flexible substrate 10, 20 than the thickness t of the first and the second rigid substrate 30, 40, as in the connection configuration according to this embodiment. The same is true when the flexible substrate 30, 40 are bent oppositely.

Figure 7:
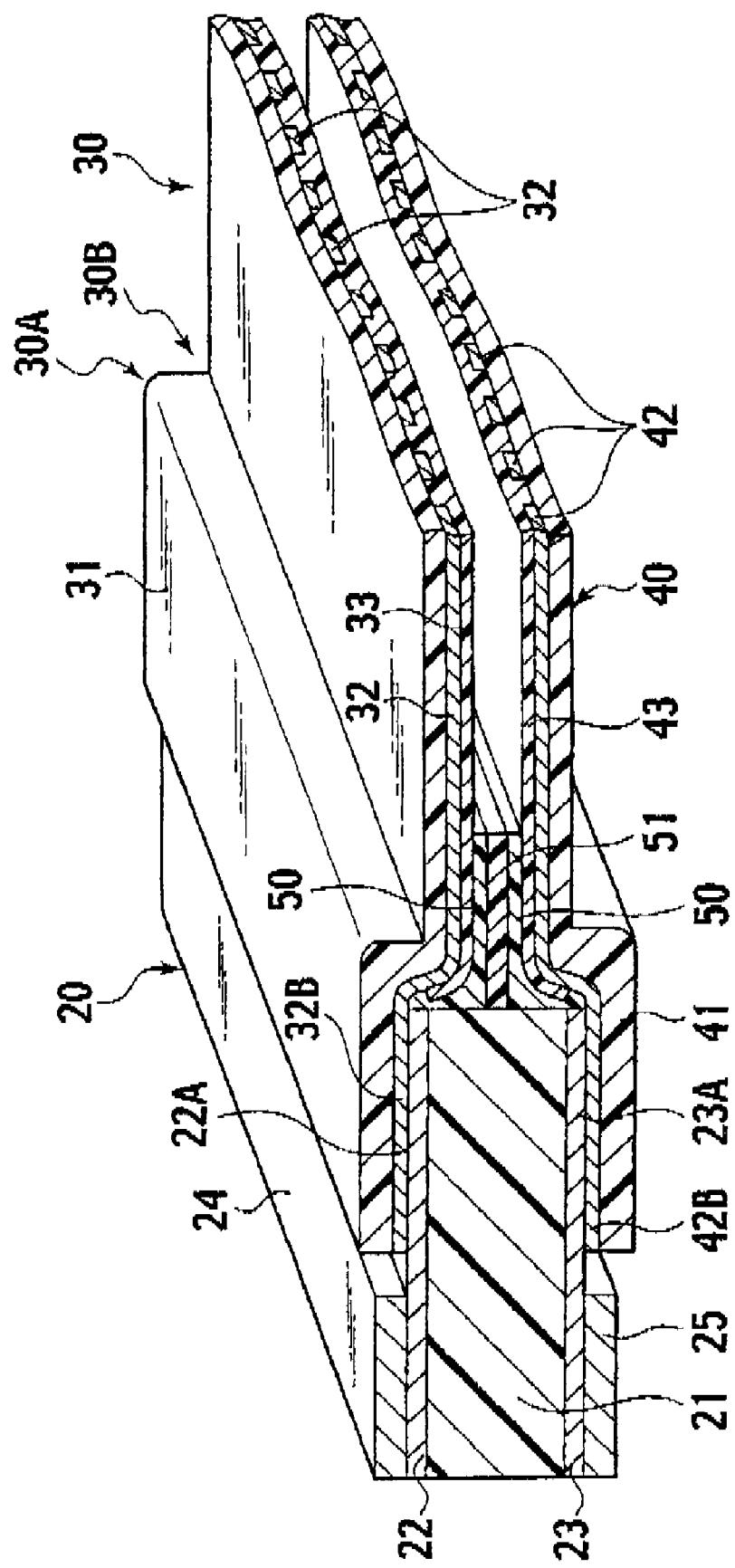
FIG. 7 is a fragmentary cross-sectional perspective view of a connection configuration according to a second embodiment of the present invention.

Referring to FIG. 7, a connection configuration according to a second non-limiting embodiment of the present invention will be described hereinafter. FIG. 7 is a fragmentary cross-sectional perspective view of the connection configuration according to the second embodiment of the present invention.

The connection configuration according to this embodiment is different from the connection configuration according to the first embodiment described above in that the first and the second flexible substrate 30, 40 are adhered via a lamination of an adhesive 50, a reinforcing plate 51, and an adhesive 50. Except for this difference, the connection configuration according to the second embodiment is the same as the connection configuration according to the first embodiment. Therefore, the same or corresponding reference marks are given to the same or corresponding members described in the first embodiment, so as to eliminate an undue repetition of explanation hereinafter. By the way, the reinforcing plate 51 can be made of a resin material such as but not limited to polyimide or the like, or a metal.

The connection configuration according to the second embodiment is formed in substantially the same manner as described to fabricate the connection configuration according to the first embodiment. However, in the second embodiment, when the first and the second flexible substrate 30, 40 are adhered using the adhesive 50, the reinforcing plate 51 having the same adhesive 50 on both side thereof is interposed by the flexible substrate 30, 40 in the vicinity of the first and the second rigid substrate, or in the space determined substantially by the curved portion 30A, 30B, the curved portion 40A, 40B, and the side face of the first or the second rigid substrate 10, 20.

According to the second embodiment, the reinforcing plate 51 enables a robust connection between the flexible substrates and the rigid substrate. This connection configuration is capable of preventing an excessive stress from being applied on where the connection terminal portions are soldered together, in comparison with where the first and the second flexible substrate 30, 40 are adhered only by the adhesive 50 as in the first embodiment.

Figure 8:
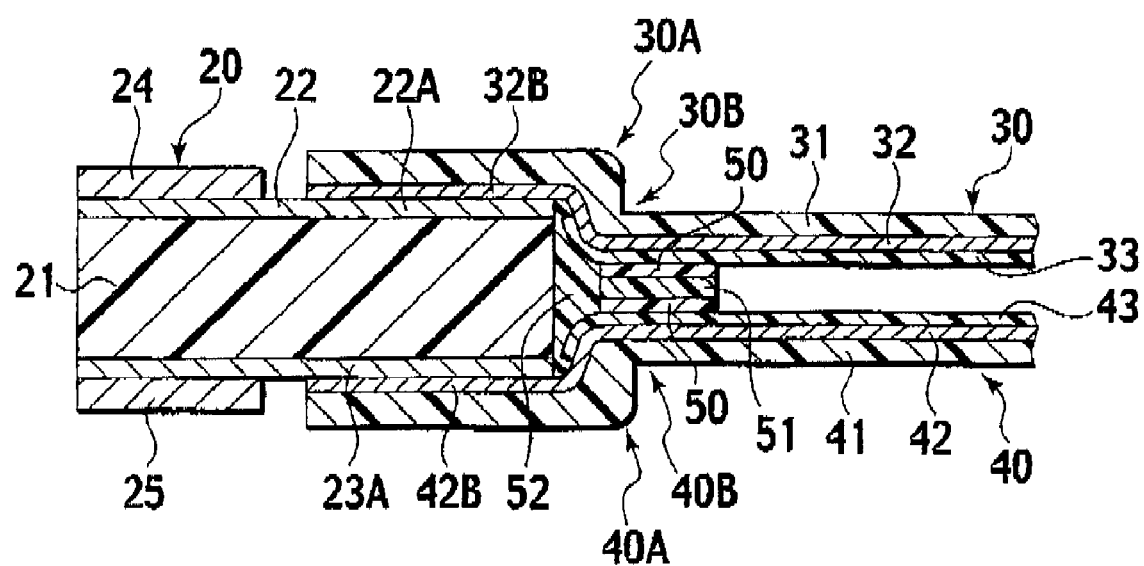
FIG. 8 is a cross-sectional view of a connection configuration according to a third embodiment of the present invention.

Referring to FIG. 8, there will be described a connection configuration according to a third non-limiting embodiment of the present invention. FIG. 8 is a cross-sectional view of the connection configuration.

The connection configuration according to this embodiment is different from the previously-described connection configuration according to the first embodiment in that in the space determined substantially by the curved portion 30A, 30B, the curved portion 40A, 40B, and the side face of the first or the second rigid substrate 10, 20 is filled with a resin 52, and the resin 52 meets a lamination structure of an adhesive 50, a reinforcing plate 51, and an adhesive 50 stacked in this order, the lamination structure adhering the first and the second flexible substrate 30, 40. Except for these differences, the connection configuration according to the third embodiment is the same as that of the first embodiment. Therefore, the same or corresponding reference marks are given to the same or corresponding member and an undue repetition of explanation is eliminated hereinafter. By the way, the reinforcing plate 51 is for example a plate made of resin such as polyimide or the like, or metal, and the resin 52 can be various types of resin adhesives such as polyimide, epoxy, olefin resin, or the like.

The connection configuration according to the third embodiment is formed in substantially the same manner as described to configure the connection configuration according to the first embodiment. Specifically, the first and the second flexible substrate 30, 40 are attached on the first and the second rigid substrate 10, 20 by soldering the connection terminal portions thereof on the connection terminal portions of the first and the second rigid substrate 10, 20 while applying a predetermined heat and pressure. However, differently from the first embodiment, the first and the second flexible substrate 30, 40 are adhered with each other in their flat portions using the lamination structure of the adhesive 50, the reinforcing plate 51, and the adhesive 50. In addition, the space determined substantially by the curved portion 30A, 30B, the curved portion 40A, 40B, the side face of the first or the second rigid substrate 10, 20, and the lamination structure is filled with the resin 52.

According to the third embodiment, the resin 52 and the lamination structure enable a robust connection between the flexible substrates and the rigid substrate. This connection structure is capable of preventing an excessive stress from being applied on where the connection terminal portions are soldered together, in comparison with where the first and the second flexible substrate 30, 40 are adhered only by the adhesive 50 as in the first embodiment.

Although the invention has been described in conjunction with the foregoing specific embodiments, many alterations and modifications will be apparent to those skilled in the art. Those alterations and modifications are intended to fall within the spirit and scope of the appended claims.

What is claimed is:

1. A connection configuration in which rigid substrates are connected via flexible substrates, comprising:
    a pair of rigid substrates each having a predetermined circuit pattern on a front and a reverse surface thereof,
    a first flexible substrate attached on the front surfaces of the pair of the rigid substrates so as to electrically connect the circuit patterns provided respectively on the front surfaces,
    a second flexible substrate attached on the reverse surfaces of the pair of the rigid substrates so as to electrically connect the circuit patterns provided respectively on the reverse surfaces,
    wherein the first and the second flexible substrate have a gap therebetween smaller than a thickness of the pair of the rigid substrates,
    wherein the first flexible substrate is attached on the front surfaces adjacent to one side surface of each rigid substrate of the pair of the rigid substrates, the first flexible substrate having a first curved portion in which the first flexible substrate bends from the front surfaces of the rigid substrates toward the reverse surfaces of the rigid substrates and having a second curved portion in which the first flexible substrate bends so as to be substantially parallel with the pair of the rigid substrates.
    wherein the second flexible substrate is attached on the reverse surfaces adjacent to the side surface of each rigid substrate of the pair of the rigid substrates, the second flexible substrate having a third curved portion in which the second flexible substrate bends from the reverse surfaces of the rigid substrates toward the front surfaces of the rigid substrates and having a fourth curved portion in which the second flexible substrate bends so as to be substantially parallel with the pair of the rigid substrates, and
    wherein a space substantially determined by the first curved portion, the second curved portion, the third curved portion, the fourth curved portion and the side surface of each of the rigid substrates is filled with a first adhesive.

2. The connection configuration as recited in claim 1, further comprising a reinforcing plate provided in the space filled with the adhesive.

3. The connection configuration as recited in claim 1, wherein the first adhesive filled in the space is a resin, and wherein the first and the second flexible substrates are connected to each other by a lamination structure composed of a second adhesive, a reinforcing plate and a third adhesive laminated in this order, the lamination structure being provided so as to contact with the resin.

4. The connection configuration as recited in claim 1, wherein a wiring pattern of the first flexible substrate opposing a wiring pattern of the second flexible substrate when the first and the second flexible substrate are attached on the pair of the rigid substrates.

* * * * *